US012615848B2

(12) United States Patent
Song et al.

(10) Patent No.: US 12,615,848 B2
(45) Date of Patent: Apr. 28, 2026

(54) ELECTROSTATIC DISCHARGE PROTECTION STRUCTURE AND CHIP

(71) Applicant: CHANGXIN MEMORY TECHNOLOGIES, INC., Hefei City (CN)

(72) Inventors: Bin Song, Hefei City (CN); Qian Xu, Hefei City (CN); Tieh-Chiang Wu, Hefei City (CN)

(73) Assignee: CHANGXIN MEMORY TECHNOLOGIES, INC., Hefei City (TW)

( * ) Notice: Subject to any disclaimer, the term of this patent is extended or adjusted under 35 U.S.C. 154(b) by 712 days.

(21) Appl. No.: 18/095,667

(22) Filed: Jan. 11, 2023

(65) Prior Publication Data

US 2023/0420444 A1     Dec. 28, 2023

Related U.S. Application Data

(63) Continuation of application No. PCT/CN2022/104450, filed on Jul. 7, 2022.

(30) Foreign Application Priority Data

Jun. 24, 2022     (CN) .......................... 202210731472.9

(51) Int. Cl.
*H10D 89/60*          (2025.01)
*H02H 9/04*          (2006.01)
(52) U.S. Cl.
CPC ......... *H10D 89/611* (2025.01); *H10D 89/711* (2025.01); *H02H 9/046* (2013.01)

(58) Field of Classification Search
CPC ..... H10D 89/611; H10D 89/711; H02H 9/046
See application file for complete search history.

(56) References Cited

U.S. PATENT DOCUMENTS 11,133,299  B2     9/2021  Lai
2011/0121394  A1     5/2011  Su
(Continued)

FOREIGN PATENT DOCUMENTS

CN          103296075  A     9/2013
CN          111046623  A     4/2020
(Continued)

OTHER PUBLICATIONS

International Search Report dated Dec. 22, 2022 for Application No. PCT/CN2022/104450.

*Primary Examiner* — Brigitte A Paterson
(74) *Attorney, Agent, or Firm* — Syncoda LLC; Feng Ma

(57) ABSTRACT

An electrostatic discharge protection structure and a chip are provided. The electrostatic discharge protection structure includes: a semiconductor substrate, an N-type well, a P-type well, a first N-type doped portion, a first P-type doped portion, a second P-type doped portion and a second N-type doped portion. The N-type well and the P-type well are located in the semiconductor substrate. The first N-type doped portion and the second P-type doped portion are located in the P-type well, and the first P-type doped portion and the second N-type doped portion are located in the N-well. The first N-type doped portion has a "T" shape structure, the first P-type doped portion has a "U" shape structure, and a part of the first N-type doped portion is located in a "U" shape opening of the first P-type doped portion.

15 Claims, 7 Drawing Sheets

(56)  References Cited

U.S. PATENT DOCUMENTS

| | | | |
|---|---|---|---|
| 2013/0228824 A1* | 9/2013 | Morishita ............ | H10D 62/126 |
| | | | 257/173 |
| 2014/0151743 A1* | 6/2014 | Ko ...................... | H10D 89/813 |
| | | | 257/139 |
| 2014/0159102 A1* | 6/2014 | Van Wijmeersch ..... | H10D 8/80 |
| | | | 257/109 |
| 2014/0327042 A1 | 11/2014 | Morishita | |

FOREIGN PATENT DOCUMENTS

| | | | |
|---|---|---|---|
| CN | 212010969 U | 11/2020 | |
| EP | 2539934 B1 | 12/2020 | |

* cited by examiner

ELECTROSTATIC DISCHARGE PROTECTION STRUCTURE AND CHIP

CROSS-REFERENCE TO RELATED APPLICATION

This application is a continuation of International Patent Application No. PCT/CN2022/104450 filed on Jul. 7, 2022, which claims priority to Chinese patent application No. 202210731472.9 filed on Jun. 24, 2022. The entire contents of the prior applications are hereby incorporated by reference in their entirety.

BACKGROUND

A chip generally needs to be provided with an electrostatic discharge (ESD) protection circuit. The electrostatic discharge protection circuit is used to discharge static electricity in the chip to avoid damage to a core circuit in the chip under the action of static electricity.

At present, a layout area of an electrostatic discharge protection structure for forming the electrostatic discharge protection circuit is large, which is not conducive to a design of the chip.

It should be noted that the information disclosed in the background section is only for enhancement of understanding of the background of the present disclosure, and therefore may contain information that does not form the prior art that is already known to a person of ordinary skill in the art.

SUMMARY

The present disclosure relates to the field of semiconductor technologies, and in particular, to an electrostatic discharge protection structure and a chip.

In a first aspect, the embodiments of the present disclosure provide an electrostatic discharge protection structure. The electrostatic discharge protection structure includes: a semiconductor substrate, an N-type well, a P-type well, a first N-type doped portion, a first P-type doped portion, a second P-type doped portion, and a second N-type doped portion. The N-type well is located in the semiconductor substrate, and the P-type well is located in the semiconductor substrate. The first N-type doped portion is located in the P-type well, and the first N-type doped portion includes a first extension portion and a second extension portion that are connected to each other. An orthographic projection of the first extension portion on a target projection plane extends along a first direction, an orthographic projection of the second extension portion on the target projection plane extends along a second direction, the target projection plane is parallel to a plane where the semiconductor substrate is located, and the first direction intersects the second direction. The first P-type doped portion is located in the N-type well, and the first P-type doped portion includes a third extension portion, a fourth extension portion, and a fifth extension portion connected between the third extension portion and the fourth extension portion. Both an orthographic projection of the third extension portion on the target projection plane and an orthographic projection of the fourth extension portion on the target projection plane extend along the second direction, the orthographic projection of the second extension portion on the target projection plane is located between the orthographic projection of the third extension portion on the target projection plane and the orthographic projection of the fourth extension portion on the target projection plane, and an orthographic projection of the fifth extension portion on the target projection plane is located on a side of the orthographic projection of the second extension portion on the target projection plane away from the orthographic projection of the first extension portion on the target projection plane. The second P-type doped portion is located in the P-type well. An orthographic projection of the second P-type doped portion on the target projection plane extends along the first direction, and is located on a side of an orthographic projection of the first N-type doped portion on the target projection plane away from an orthographic projection of the first P-type doped portion on the target projection plane. The second N-type doped portion is located in the N-type well. An orthographic projection of the second N-type doped portion on the target projection plane extends along the first direction, and is located on a side of the orthographic projection of the first P-type doped portion on the target projection plane away from the orthographic projection of the first N-type doped portion on the target projection plane. The second P-type doped portion is electrically connected to the second N-type doped portion.

In a second aspect, the embodiments of the present disclosure provide a chip. The chip includes the electrostatic discharge protection structure in the first aspect.

It is to be understood that the foregoing general description and the following detailed description are exemplary and explanatory only and are not intended to limit the present disclosure.

BRIEF DESCRIPTION OF THE DRAWINGS

The accompanying drawings, which are incorporated in and constitute a part of this specification, illustrate embodiments consistent with the present disclosure and together with the description serve to explain the principles of the present disclosure. It is apparent that the drawings in the following description are only some embodiments of the present disclosure, and for those of ordinary skill in the art, other drawings can also be obtained from these drawings without creative effort.

DETAILED DESCRIPTION

Figure 1:
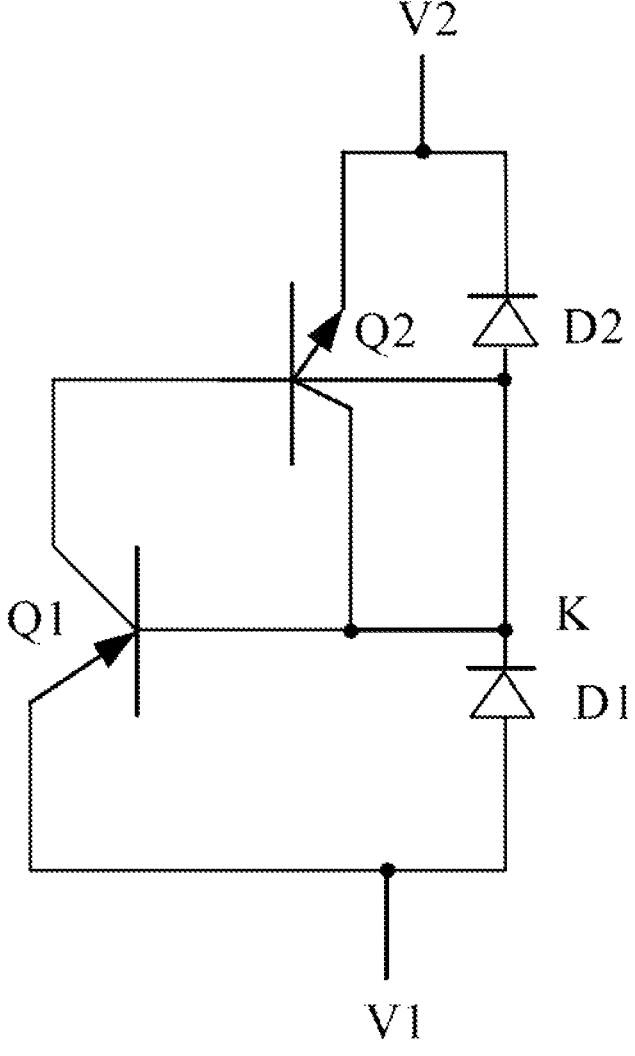
FIG. 1 is an equivalent circuit diagram of an exemplary embodiment of an electrostatic discharge protection circuit of the present disclosure.

Example embodiments will now be described more fully with reference to the accompanying drawings. Example embodiments, however, can be implemented in various forms and should not be construed as being limited to the examples set forth herein. Rather, these embodiments are provided so that the present disclosure will be more comprehensive and complete, and will fully convey the concept of example embodiments to those skilled in the art. The same reference numerals in the drawings denote the same or similar structures, and thus their detailed descriptions will be omitted.

Although relative terms such as "above" and "below" are used in this specification to describe the relative relationship of one component of an icon to another component, these terms are used in this specification only for convenience, such as according to the direction of the example described in the accompany drawings. It will be appreciated that if the device of the icon is turned upside down, the component described as "above" will become the component described as "below". Other relative terms, such as "high", "low", "top". "bottom", "left" and "right", are also used to have similar meanings. When a structure is "above" other structures, it may mean that the structure is integrally located on other structures, or that the structure is "directly" arranged on other structure, or that the structure is "indirectly" arranged on other structures through another structure.

The terms "a", "an" and "the" are used to indicate the existence of one or more elements/components/etc. The terms "include/comprise" and "have" are used to indicate an open-ended inclusive meaning and mean that additional elements/components/etc. may exist in addition to the listed elements/components/etc.

An exemplary embodiment first provides an electrostatic discharge protection circuit. FIG. 1 is an equivalent circuit diagram of the exemplary embodiment of the electrostatic discharge protection circuit of the present disclosure. The electrostatic discharge protection circuit may include a PNP transistor Q1, an NPN transistor Q2, a first diode D1, and a second diode D2. An emitter of the PNP transistor Q1 is connected to a first signal terminal V1, a base and a collector of the PNP transistor Q1 are connected to a node K; an emitter of the NPN transistor Q2 is connected to a second signal terminal V2, and a base and a collector of the NPN transistor Q2 are connected to the node K. An anode of the first diode D1 is connected to the first signal terminal V1, a cathode of the first diode D1 is connected to the node K. An anode of the second diode D2 is connected to the node K, and a cathode of the second diode D2 is connected to the second signal terminal V2.

The electrostatic discharge protection circuit can quickly discharge static electricity at the first signal terminal V1 to the second signal terminal V2. In a case that the static electricity occurs at the first signal terminal V1, the first diode D1 and the second diode D2 are turned on at first. Under an action of self-impedance of the first diode D1, a voltage difference is generated between the first signal terminal V1 and the node K, and the voltage difference between the first signal terminal V1 and the node K triggers turning on of the PNP transistor Q1. Under an action of self-impedance of the second diode D2, a voltage difference is generated between the second signal terminal V2 and the node K, and the voltage difference between the second signal terminal V2 and the node K triggers turning on of the NPN transistor Q2. Since threshold voltages of the first diode D1 and the second diode D2 are small, so that the electrostatic discharge protection circuit can have a small trigger voltage.

Figure 2:
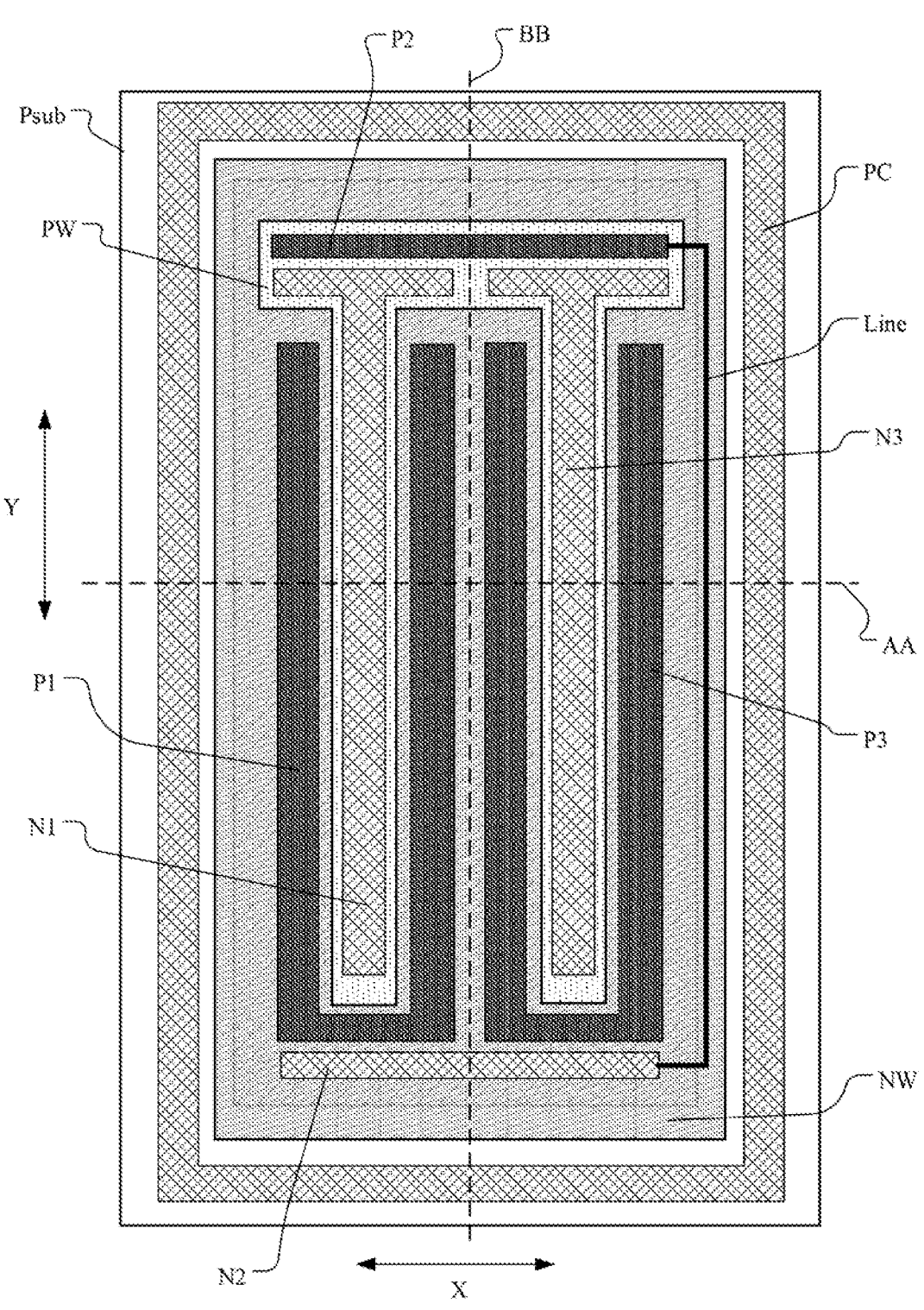
FIG. 2 is a structural layout of an exemplary embodiment of an electrostatic discharge protection structure of the present disclosure.
Figure 3:
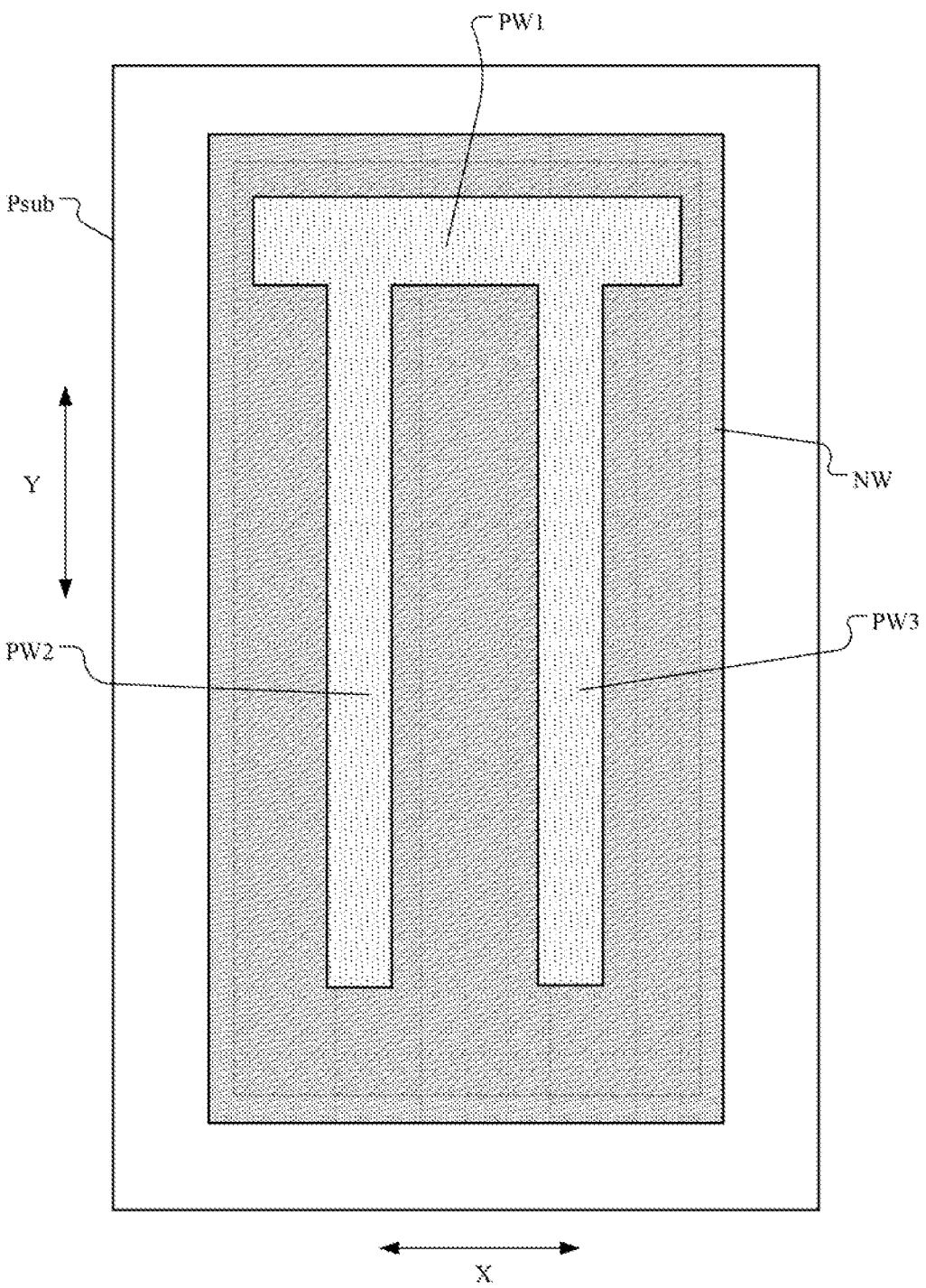
FIG. 3 is a structural layout of well regions in FIG. 2.
Figure 4:
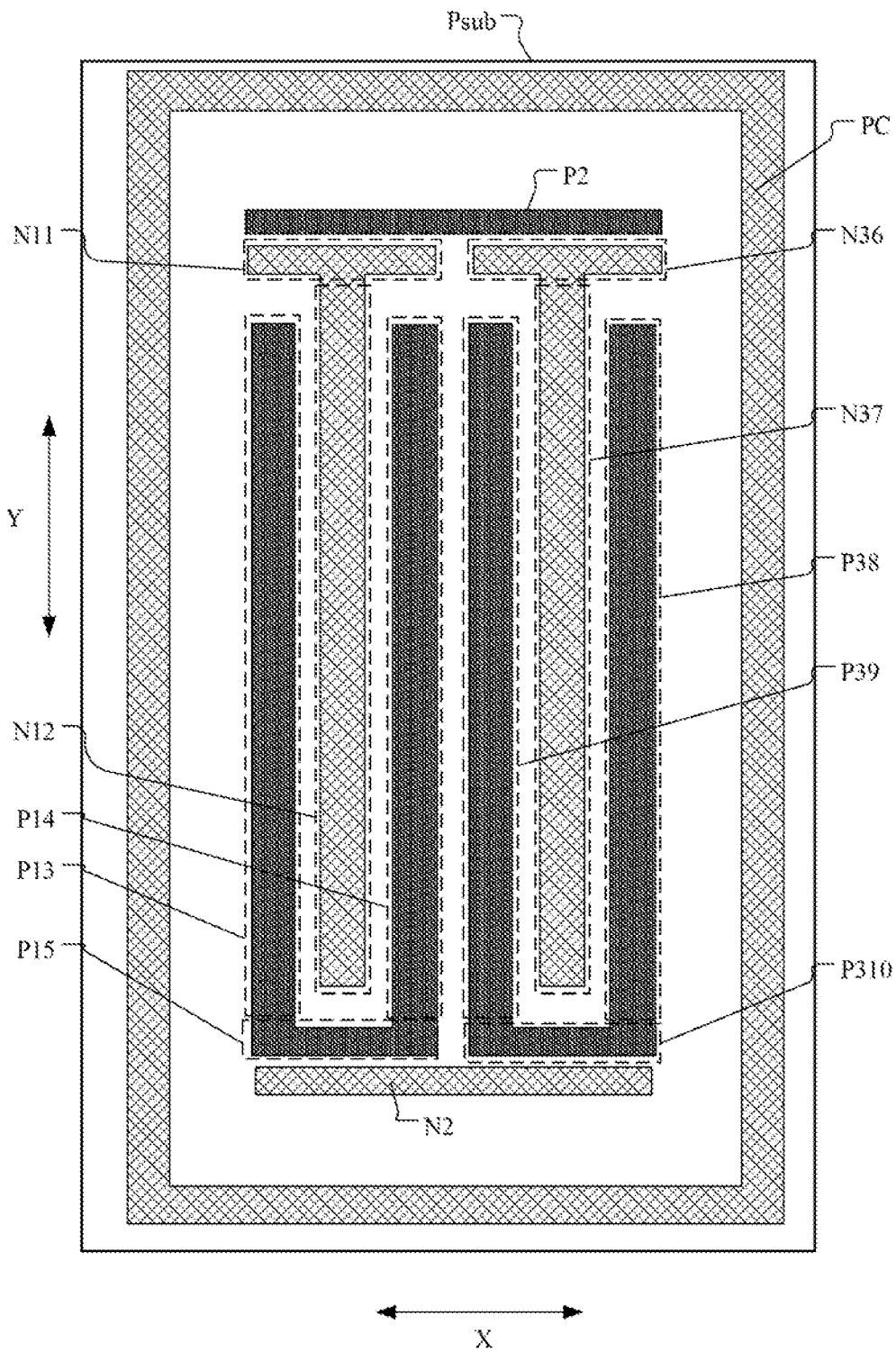
FIG. 4 is a structural layout of doped portions in FIG. 2.
Figure 5:
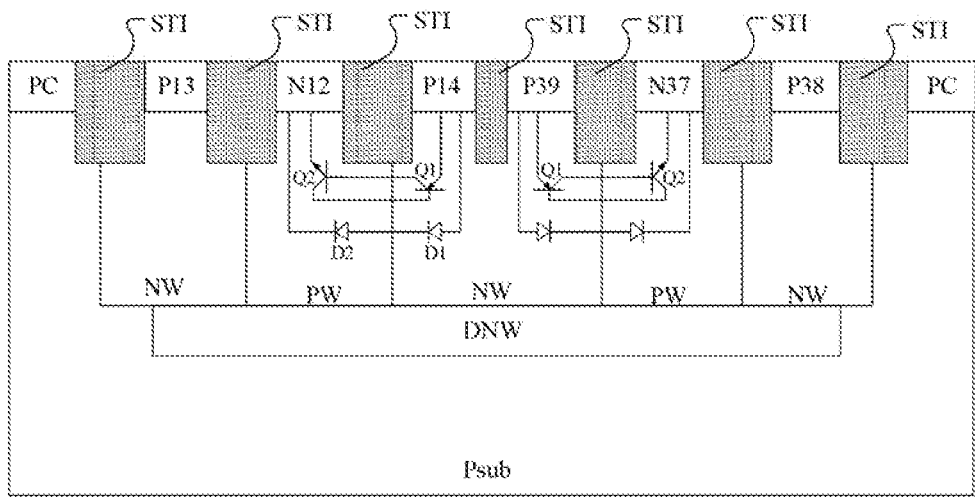
FIG. 5 is a cross-sectional view of the electrostatic discharge protection structure shown in FIG. 2 along the dashed line AA.
Figure 6:
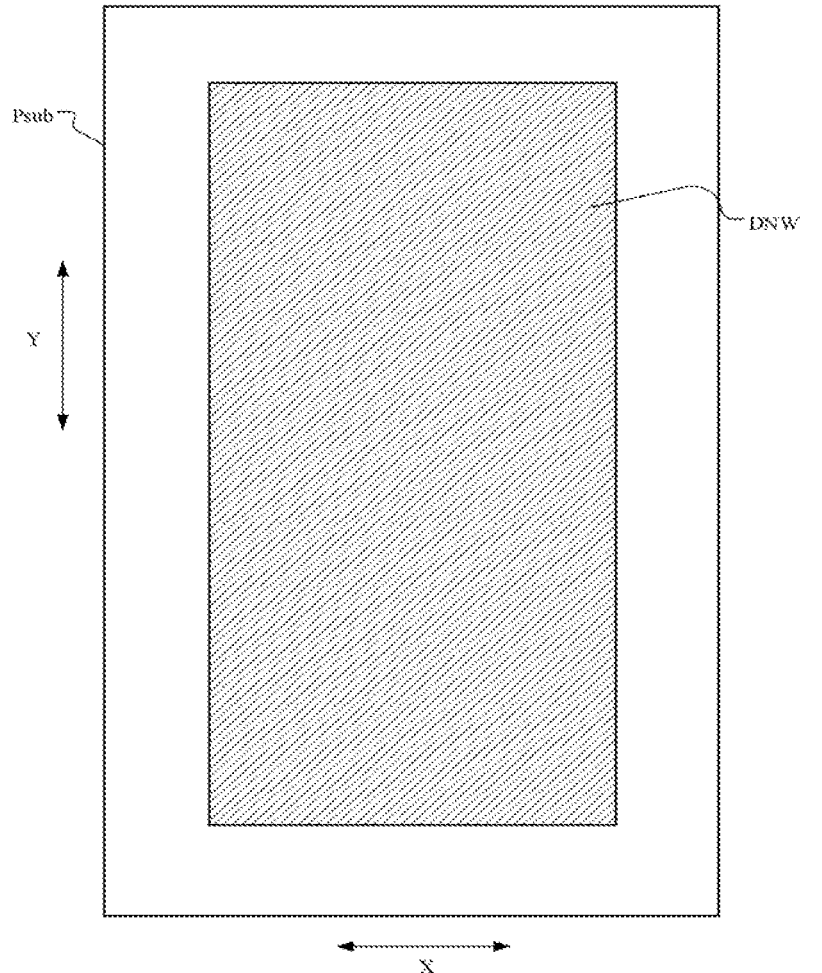
FIG. 6 is a structural layout of a deep well in FIG. 2.

As shown in FIGS. 2-5, FIG. 2 is a structural layout of an exemplary embodiment of an electrostatic discharge protection structure of the present disclosure, FIG. 3 is a structural layout of well regions in FIG. 2, FIG. 4 is a structural layout of doped portions in FIG. 2, and FIG. 5 is a cross-sectional view of the electrostatic discharge protection structure shown in FIG. 2 along the dashed line AA. The electrostatic discharge protection structure may include: a semiconductor substrate Psub, an N-type well NW, a P-type well PW, a first N-type doped portion N1, a first P-type doped portion P1, a second P-type doped portion P2, and a second N-type doped portion N2. The N-type well NW is located in the semiconductor substrate Psub. and the P-type well PW is located in the semiconductor substrate Psub. The first N-type doped portion N1 is located in the P-type well PW, and the first N-type doped portion N1 includes a first extension portion N11 and a second extension portion N12 that are connected to each other. An orthographic projection of the first extension portion N11 on a target projection plane extends along a first direction X, and an orthographic projection of the second extension portion N12 on the target projection plane extends along a second direction Y. The target projection plane is parallel to a plane where the semiconductor substrate Psub is located. The first direction X intersects the second direction Y. For example, the first direction X is perpendicular to the second direction Y. The first P-type doped portion P1 is located in the N-type well NW, and the first P-type doped portion P1 includes a third extension portion P13, a fourth extension portion P14, and a fifth extension portion P15 connected between the third extension portion P13 and the fourth extension portion P14. Both an orthographic projection of the third extension portion P13 on the target projection plane and an orthographic projection of the fourth extension portion P14 on the target projection plane extend along the second direction Y. The orthographic projection of the second extension portion N12 on the target projection plane is located between the orthographic projection of the third extension portion P13 on the target projection plane and the orthographic projection of the fourth extension portion P14 on the target projection plane, and an orthographic projection of the fifth extension portion P15 on the target projection plane is located on a side of the orthographic projection of the second extension portion N12 on the target projection plane away from the orthographic projection of the first extension portion N11 on the target projection plane. The second P-type doped portion P2 is located in the P-type well PW. An orthographic projection of the second P-type doped portion P2 on the target projection plane extends along the first direction X, and is located on a side of an orthographic projection of the first N-type doped portion N1 on the target projection plane away from an orthographic projection of the first P-type doped portion P1 on the target projection plane. The second N-type doped portion N2 is located in the N-type well NW. An orthographic projection of the second N-type doped portion N1 on the target projection plane extends along the first direction X, and is located on a side of the orthographic projection of the first P-type doped portion P1 on the target projection plane away from the orthographic projection of the first N-type doped portion N1 on the plane where the semiconductor substrate Psub is located. The second P-type doped portion P2 is electrically connected to the second N-type doped portion N2.

The electrostatic discharge protection structure shown in FIG. 2 may include the electrostatic discharge protection circuit shown in FIG. 1. The first P-type doped portion P1 can be used to form the emitter of the PNP transistor Q1, the N-type well NW can be used to form the base of the PNP transistor Q1, and the P-type well PW can be used to form the collector of the PNP transistor Q1. The first N-type doped portion N1 can be used to form the emitter of the NPN transistor Q2, the P-type well PW can be used to form the base of the NPN transistor Q2, and the N-type well NW can be used to form the collector of the NPN transistor Q2. The first P-type doped portion P1 can be used to form the anode of the first diode D1, and the N-type well NW can be used to form the cathode of the first diode D1. The P-type well PW can be used to form the anode of the second diode D2, and the first N-type doped portion N1 can be used to form the cathode of the second diode D2. The second P-type doped portion P2 is electrically connected to the second N-type doped portion N2, so as to connect the N-type well NW to the P-type well PW, so that the cathode of the first diode D1 can be connected to the anode of the second diode D2.

In the present exemplary embodiment, the second P-type doped portion P2 and the second N-type doped portion N2 may be connected by a conductive line, and the conductive line may be formed on a surface of the semiconductor substrate.

As shown in FIGS. 2-5, in the present exemplary embodiment, the first N-type doped portion N1 has a "T" shape structure, the first P-type doped portion P1 has a "U" shape structure, and the second extension portion N12 of the first N-type doped portion N1 is inserted into a "U" shape opening of the first P-type doped portion P1. In the present exemplary embodiment, the first extension portion N11 and the second extension portion N12 together form the emitter of the NPN transistor Q2, and the third extension portion P13, the fourth extension portion P14 and the fifth extension portion P15 together form the emitter of the PNP transistor Q1. Compared with the related art in which the N-type doped portion and the P-type doped portion are arranged in a strip shape, the arrangement of the present disclosure can increase an effective size of the PNP transistor Q1 and the NPN transistor Q2 in a limited space, thereby improving a speed of discharging the static electricity through a conductive channel formed by the PNP transistor Q1 and the NPN transistor Q2, while reducing the trigger voltage. In addition, in the present exemplary embodiment, both the orthographic projection of the second N-type doped portion N2 on the target projection plane and the orthographic projection of the second P-type doped portion P2 on the target projection plane extend along the first direction X, and the second P-type doped portion P2 and the second N-type doped portion N2 are respectively arranged on both sides of the PNP transistor Q1 and the NPN transistor Q2 in the second direction Y. Such an arrangement further reduces a size of the electrostatic discharge protection structure in the first direction X.

It should be noted that the plane where the semiconductor substrate Psub is located can be understood as the plane where a side surface of the semiconductor substrate Psub away from the first N-type doped portion N1 is located. In the present exemplary embodiment, the semiconductor substrate Psub may be a P-type semiconductor substrate. In the present exemplary embodiment, the P-type well formed in the P-type semiconductor substrate Psub may be directly formed by a part of the P-type semiconductor substrate Psub. That is to say, the P-type well can be formed without further doping the P-type semiconductor substrate Psub. It should be understood that in other exemplary embodiments, the semiconductor substrate may also be an N-type semiconductor substrate, and correspondingly, the N-type well formed in the N-type semiconductor substrate may be directly formed by a part of the N-type semiconductor substrate.

As shown in FIGS. 2-5, the electrostatic discharge protection structure may further include: a third N-type doped portion N3 and a third P-type doped portion P3. The third N-type doped portion N3 is located in the P-type well PW, and an orthographic projection of the third N-type doped portion N3 on the target projection plane and the orthographic projection of the first N-type doped portion N1 on the target projection plane are arranged at intervals in the first direction X. The third N-type doped portion N3 includes a sixth extension portion N36 and a seventh extension portion N37 that are connected to each other. An orthographic projection of the sixth extension portion N36 on the target projection plane extends along the first direction X, and an orthographic projection of the seventh extension portion N37 on the target projection plane extends along the second direction Y The third P-type doped portion P3 is located in the N-type well NW. An orthographic projection of the third P-type doped portion P3 on the target projection plane and the orthographic projection of the first P-type doped portion P1 on the target projection plane are arranged at intervals in the first direction X. The third P-type doped portion P3 includes an eighth extension portion P38, a ninth extension portion P39, and a tenth extension portion P310 connected between the eighth extension portion P38 and the ninth extension portion P39. Both an orthographic projection of the eighth extension portion P38 on the target projection plane and an orthographic projection of the ninth extension portion P39 on the target projection plane extend along the second direction Y, the orthographic projection of the seventh extension portion N37 on the target projection plane is located between the orthographic projection of the eighth extension portion P38 on the target projection plane and the orthographic projection of the ninth extension portion P39 on the target projection plane, and an orthographic projection of the tenth extension portion P310 on the target projection plane is located on a side of the orthographic projection of the seventh extension portion N37 on the target projection plane away from the orthographic projection of the sixth extension portion N36 on the target projection plane.

In the present exemplary embodiment, as shown in FIGS. 2-5, the electrostatic discharge protection structure may include two electrostatic discharge protection circuits (each is the electrostatic discharge protection circuit shown in FIG. 1). The third P-type doped portion P3 and the third N-type doped portion N3 can be used to form the other electrostatic discharge protection circuit. The third P-type doped portion P3 can be used to form the emitter of the PNP transistor Q1, the N-type well NW can be used to form the base of the PNP transistor Q1, and the P-type well PW can be used to form the collector of the PNP transistor Q1. The third N-type doped portion N3 can be used to form the emitter of the NPN transistor Q2, the P-type well PW can be used to form the base of the NPN transistor Q2, and the N-type well NW can be used to form the collector of the NPN transistor Q2. The third P-type doped portion P3 can be used to form the anode of the first diode D1, and the N-type well NW can be used to form the cathode of the first diode D1. The P-type well PW can be used to form the anode of the second diode D2, and the third N-type doped portion N3 can be used to form the cathode of the second diode D2.

In the present exemplary embodiment, as shown in FIGS. 2-5, the sixth extension portion N36 and the seventh extension portion N37 together form the emitter of the NPN transistor Q2. The eighth extension portion P38, the ninth extension portion P39, and the tenth extension portion P310 together form the emitter of the PNP transistor Q1. Such an arrangement can also improve the speed of discharging the static electricity through the conductive channel formed by the PNP transistor Q1 and the NPN transistor Q2, while reducing a trigger voltage.

In the present exemplary embodiment, as shown in FIGS. 2-5, the orthographic projection of the first P-type doped portion P1 on the target projection plane and the orthographic projection of the third P-type doped portion P3 on the target projection plane can be arranged symmetrically along the dashed line BB. The orthographic projection of the first N-type doped portion N1 on the target projection plane and the orthographic projection of the third N-type doped portion N3 on the target projection plane can be arranged symmetrically along the dashed line BB. An extension length of the orthographic projection of the second extension portion N12 on the target projection plane may be greater than an extension length of the orthographic projection of the first extension portion N11 on the target projection plane, and an extension length of the orthographic projection of the seventh extension portion N37 on the target projection plane may be greater than an extension length of the orthographic projection of the sixth extension portion N36 on the target projection plane.

In the present exemplary embodiment, as shown in FIGS. 2-5, the orthographic projection of the second P-type doped portion P2 on the target projection plane is located on a side of the orthographic projection of the third N-type doped portion N3 on the target projection plane away from the orthographic projection of the third P-type doped portion P3 on the target projection plane. The orthographic projection of the second N-type doped portion N2 on the target projection plane is located on a side of the orthographic projection of the third P-type doped portion P3 on the target projection plane away from the orthographic projection of the third N-type doped portion N3 on the target projection plane.

In the present exemplary embodiment, as shown in FIGS. 2-5, a part of the first extension portion N11 and at least part of the third extension portion P13 are oppositely arranged in the second direction Y, and another part of the first extension portion N11 and at least part of the fourth extension portion P14 are oppositely arranged in the second direction Y. A part of the sixth extension portion N36 and at least part of the eighth extension portion P38 are oppositely arranged in the second direction Y, and another part of the sixth extension portion N36 and at least part of the ninth extension portion P39 are oppositely arranged in the second direction Y. It should be noted that in the present exemplary embodiment, a structure A and a structure B are oppositely arranged in a direction, which can be understood as: an area covered by infinite movement of an orthographic projection of the structure A on the target projection plane in the direction coincides with an area covered by infinite movement of an orthographic projection of the structure B on the target projection plane in the direction. Such an arrangement can further reduce the size of the electrostatic discharge protection structure in the first direction X.

In the present exemplary embodiment, as shown in FIGS. 2-5, at least part of the first extension portion N11 and at least part of the sixth extension portion N36 may be oppositely arranged in the first direction X. For example, the first extension portion N11 and the sixth extension portion N36 may be oppositely arranged in the first direction X. At least part of the fifth extension portion PIS and at least part of the tenth extension portion P310 may be oppositely arranged in the first direction X. For example, the fifth extension portion P15 and the tenth extension portion P310 may be oppositely arranged in the first direction X. Such an arrangement can reduce the size of the electrostatic discharge protection structure in the second direction Y.

In the present exemplary embodiment, as shown in FIGS. 2-5, at least part of the first extension portion N11 and a part of the second P-type doped portion P2 are oppositely arranged in the second direction Y, at least part of the sixth extension portion N36 and another part of the second P-type doped portion P2 are oppositely arranged in the second direction Y. At least pan of the fifth extension portion P15 and a part of the second N-type doped portion N2 are oppositely arranged in the second direction Y, and at least part of the tenth extension portion P310 and another part of the second N-type doped portion N2 are oppositely arranged in the second direction Y. Such an arrangement can not only ensure that the electrostatic discharge protection structure has a small size in the first direction X, but also ensure that both the second N-type doped portion N2 and the second P-type doped portion P2 have a certain extension length, thereby reducing a contact resistance between the cathode of the first diode D1 and the anode of the second diode D2.

In the present exemplary embodiment, as shown in FIGS. 2-5, the P-type well PW includes: a first well region PW1, a second well region PW2, and a third well region PW3. An orthographic projection of the first well region PW1 on the target projection plane extends along the first direction X. The second well region PW2 is connected to the first well region PW1, and an orthographic projection of the second well region PW2 on the target projection plane extends along the second direction Y. The third well region PW3 is connected to the first well region PW1, an orthographic projection of the third well region PW3 on the target projection plane extends along the second direction Y, and the orthographic projection of the third well region PW3 on the target projection plane and the orthographic projection of the second well region PW2 on the target projection plane are located on a same side of the orthographic projection of the first well region PW1 on the target projection plane. The first extension portion N11, the sixth extension portion N36 and the second P-type doped portion P2 are located in the first well region PW1, the second extension portion N12 is located in the second well region PW2, and the seventh extension portion N37 is located in the third well region PW3.

In the present exemplary embodiment, as shown in FIGS. 2-5, the electrostatic discharge protection structure may further include: an annular doped portion PC. An orthographic projection of the annular doped portion PC on the target projection plane surrounds an orthographic projection of the N-type well NW on the target projection plane and an orthographic projection of the P-type well PW on the target projection plane. A doping type of the annular doped portion PC is the same as a doping type of the semiconductor substrate Psub. The annular doped portion PC can be connected to a stable power supply terminal. For example, the annular doped portion PC can be grounded. Such an arrangement can electrically isolate the electrostatic discharge protection structure from other structures on the semiconductor substrate.

In the present exemplary embodiment, as shown in FIG. 5, adjacent doped portions may be isolated by an isolation wall (i.e., shallow trench isolation, STI).

In the present exemplary embodiment, as shown in FIGS. 2-6, FIG. 6 is a structural layout of a deep well in FIG. 2. The orthographic projection of the N-type well NW on the target projection plane surrounds the orthographic projection of the P-type well PW on the target projection plane. The semiconductor substrate Psub may be a P-type semiconductor substrate. The electrostatic discharge protection structure may also include an N-type deep well DNW. The N-type deep well DNW is isolated between the semiconductor substrate Psub and the P-type well PW. The N-type deep well DNW can form a PN junction with the P-type semiconductor substrate, thereby improving the problem of current leakage from the P-type well PW to the semiconductor substrate Psub. It should be understood that in other exemplary embodiments, in a case that the semiconductor substrate is an N-type semiconductor substrate, the electrostatic discharge protection structure may include a P-type deep well. The P-type deep well may be isolated between the N-type well and the N-type semiconductor substrate Psub, and the P-type deep well can form a PN junction with the N-type well, thereby also improving the problem of current leakage from the N-type well to the semiconductor substrate Psub. In addition, the deep well can also play a role of noise shielding for components in the N-type well NW and the P-type well PW.

In the present exemplary embodiment, a doping concentration of a doped well (e.g., the P-type well, the N-type well, the N-type deep well) may be less than a doping concentration of a doped portion (e.g., the first N-type doped portion, the first P-type doped portion, the second N-type doped portion, the second P-type doped portion, the third N-type doped portion, the third P-type doped portion, the annular doped portion).

In other exemplary embodiments, the electrostatic discharge protection structure may only include one electrostatic discharge protection circuit shown in FIG. 1, and correspondingly, the electrostatic discharge protection structure may not include the third P-type doped portion P3 and the third N-type doped portion N3.

An exemplary embodiment further provides a chip. The chip may include the above-mentioned electrostatic discharge protection structure.

In the present exemplary embodiment, the chip may include a first terminal and a second terminal. The first terminal is connected to the first N-type doped portion N1, and the second terminal is connected to the first P-type doped portion P1. In the present exemplary embodiment, the chip may include a high level power supply terminal, a low level power supply terminal, and a signal transmission terminal. The first terminal may be the high level power supply terminal, and the second terminal may be the signal transmission terminal. Alternatively, the first terminal may be the signal transmission terminal, and the second terminal may be the low level power supply terminal. Alternatively, the first terminal may be the high level power supply terminal, and the second terminal may be the low level power supply terminal. The signal transmission terminal may include at least one of a signal input terminal or a signal output terminal.

Figure 7:
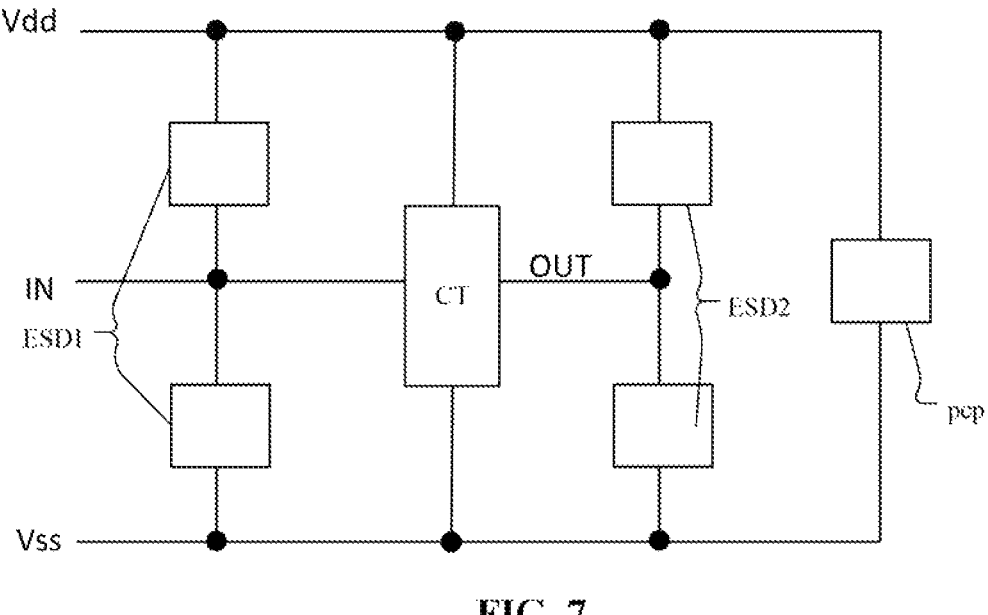
FIG. 7 is a structural diagram of an exemplary embodiment of a chip of the present disclosure.

FIG. 7 is a structural diagram of an exemplary embodiment of a chip of the present disclosure. The chip may include a high level power supply terminal Vdd, a low level power supply terminal Vss, a signal transmission terminal, and a core processing circuit CT. The signal transmission terminal may include a signal output terminal OUT and a signal input terminal IN. In the present exemplary embodiment, the chip may include a plurality of electrostatic discharge protection structures (each is the electrostatic discharge protection structure shown in FIG. 2), and the plurality of electrostatic discharge protection structures may include: a first electrostatic discharge protection structure ESD1 and a second electrostatic discharge protection structure ESD2. The first P-type doped portion and the third N-type doped portion of the first electrostatic discharge protection structure ESD1 are connected to the signal input terminal IN, the first N-type doped portion of the first electrostatic discharge protection structure ESD1 is connected to the high level power supply terminal Vdd, and the third P-type doped portion of the first electrostatic discharge protection structure ESD1 is connected to the low level power supply terminal Vss. The first P-type doped portion and the third N-type doped portion of the second electrostatic discharge protection structure ESD2 are connected to the signal output terminal OUT, the first N-type doped portion of the second electrostatic discharge protection structure ESD2 is connected to the high level power supply terminal Vdd, and the third P-type doped portion of the second electrostatic discharge protection structure ESD2 is connected to the low level power supply terminal Vss. It should be noted that the low level power supply terminal Vss may be a ground terminal of the chip where the electrostatic discharge protection structure is located, and the high level power supply terminal Vdd may be a power supply terminal of the chip where the electrostatic discharge protection structure is located.

The low level power supply terminal Vss can discharge static electricity to the signal input terminal IN through the first electrostatic discharge protection structure ESD1. The signal input terminal IN can discharge static electricity to the high level power supply terminal Vdd through the first electrostatic discharge protection structure ESD1. The signal output terminal OUT can discharge static electricity to the high level power supply terminal Vdd through the second electrostatic discharge protection structure ESD2. The low level power supply terminal Vss can discharge static electricity to the signal output terminal OUT through the second electrostatic discharge protection structure ESD2.

Figure 8:
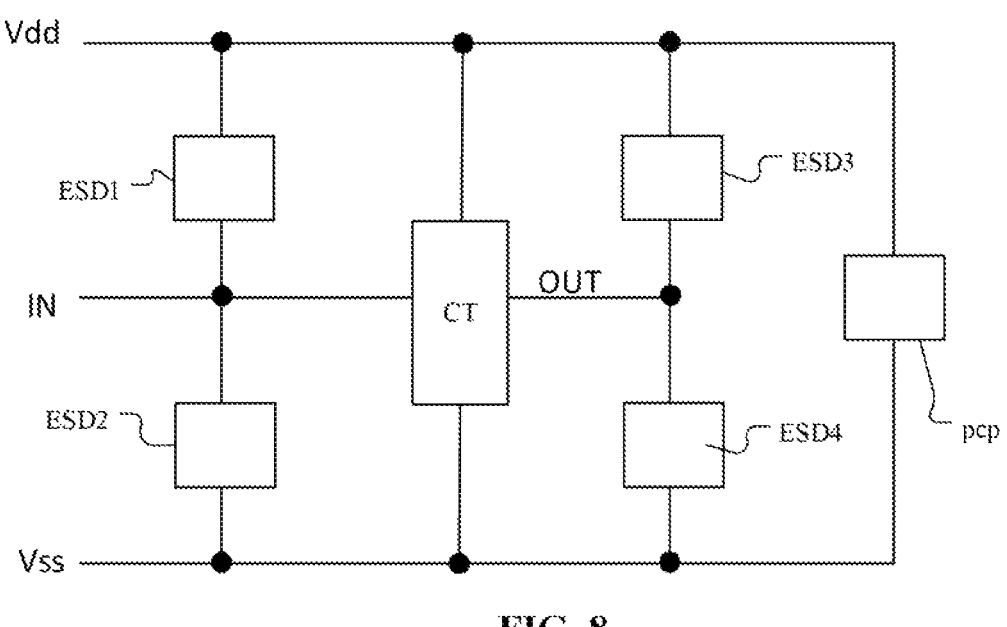
FIG. 8 is a structural diagram of another exemplary embodiment of a chip of the present disclosure.

FIG. 8 is a structural diagram of another exemplary embodiment of a chip of the present disclosure. The chip may also include a high level power supply terminal Vdd, a low level power supply terminal Vss, a signal transmission terminal, and a core processing circuit CT. The signal transmission terminal includes a signal output terminal OUT and a signal input terminal IN. In the present exemplary embodiment, the chip may include a first electrostatic discharge protection structure ESD1, a second electrostatic discharge protection structure ESD2, a third electrostatic discharge protection structure ESD3, and a fourth electrostatic discharge protection structure ESD4. At least part of the first electrostatic discharge protection structure ESD1, the second electrostatic discharge protection structure ESD2, the third electrostatic discharge protection structure ESD3 and the fourth electrostatic discharge protection structure ESD4 may be the above-mentioned electrostatic discharge protection structure. The above-mentioned electrostatic discharge protection structure may include one or two electrostatic discharge protection circuits (each is the electrostatic discharge protection circuit shown in FIG. 1). For example, each of the second electrostatic discharge protection structure ESD2 and the fourth electrostatic discharge protection structure ESD4 may have the structure as shown in FIG. 2. The first P-type doped portion and the third N-type doped portion of the second electrostatic discharge protection structure ESD2 are connected to the signal input terminal IN, and the first N-type doped portion and the third P-type doped portion of the second electrostatic discharge protection structure ESD2 are connected to the low level power supply terminal Vss. The first P-type doped portion and the third N-type doped portion of the fourth electrostatic discharge protection structure ESD4 are connected to the signal output terminal OUT, the first N-type doped portion and the third P-type doped portion of the fourth electrostatic discharge protection structure ESD4 are connected to the low level power supply terminal Vss. The low level power supply terminal Vss and the signal input terminal IN can realize the discharging of static electricity in both directions through the second electrostatic discharge protection structure ESD2. The low level power supply terminal Vss and the signal output terminal OUT can realize the discharging of static electricity in both directions through the fourth electrostatic discharge protection structure ESD4. The first electrostatic discharge protection structure ESD1 and the third electrostatic discharge protection structure ESD3 may include diode structures. An anode of the diode in the first electrostatic discharge protection structure ESD1 is connected to the signal input terminal IN, and a cathode of the diode in the first electrostatic discharge protection structure ESD1 is connected to the high level power supply terminal Vdd. An anode of the diode in the third electrostatic discharge protection structure ESD3 is connected to the signal output terminal OUT, and a cathode of the diode in the third electrostatic discharge protection structure ESD3 is connected to the high level power supply terminal Vdd.

In the present exemplary embodiment, the chip may be a dynamic random access memory or a static random access memory. It should be understood that the chip can also be other chips, the chip can also include other signal transmission terminals, and other signal terminals can also discharge static electricity through the above-mentioned electrostatic discharge protection structure(s).

Figure 9:
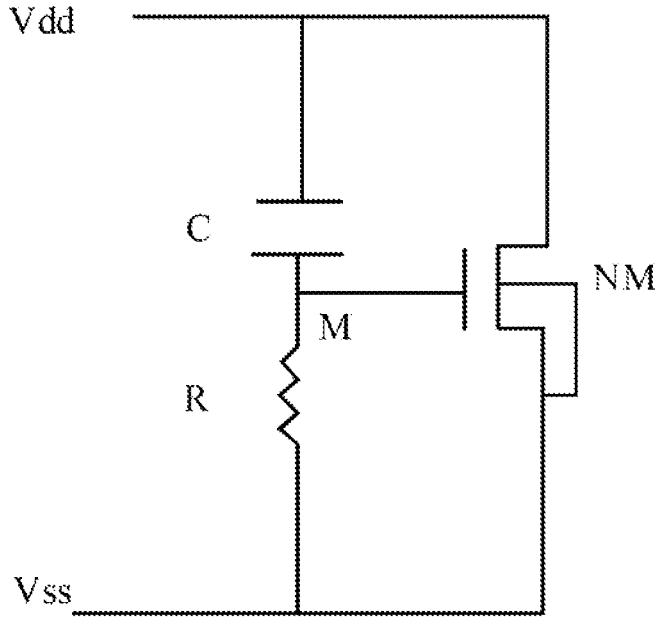
FIG. 9 is a structural diagram of a clamping circuit in an exemplary embodiment of a chip of the present disclosure.

As shown in FIG. 7 and FIG. 8, the chip may further include a clamping circuit pcp. FIG. 9 is a structural diagram of a clamping circuit in an exemplary embodiment of a chip of the present disclosure. The clamping circuit pcp may include a capacitor C, a resistor R, and an N-type transistor NM. The capacitor C is connected between the high level power supply terminal Vdd and a node M, and the resistor R is connected between the node M and the low level power supply terminal Vss. A gate electrode of the N-type transistor NM is connected to the node M, a first electrode of the N-type transistor NM is connected to the high level power supply terminal Vdd, a second electrode of the N-type transistor NM is connected to the low level power supply terminal Vss, and a semiconductor substrate of the N-type transistor NM can be connected to the second electrode of the N-type transistor NM. When static electricity occurs at the high level power supply terminal Vdd, a voltage of the high level power supply terminal Vdd rises, under the coupling effect of the capacitor C, a potential of the node M rises, the N-type transistor NM is turned on, and the high level power supply terminal Vdd can discharge static electricity to the low level power supply terminal Vss through the N-type transistor NM. It should be understood that in other exemplary embodiments, the semiconductor substrate of the N-type transistor NM can also be connected to the gate electrode of the N-type transistor NM, so that the N-type transistor NM can form a substrate driving transistor which can be used to discharge large electrostatic currents.

Figure 10:
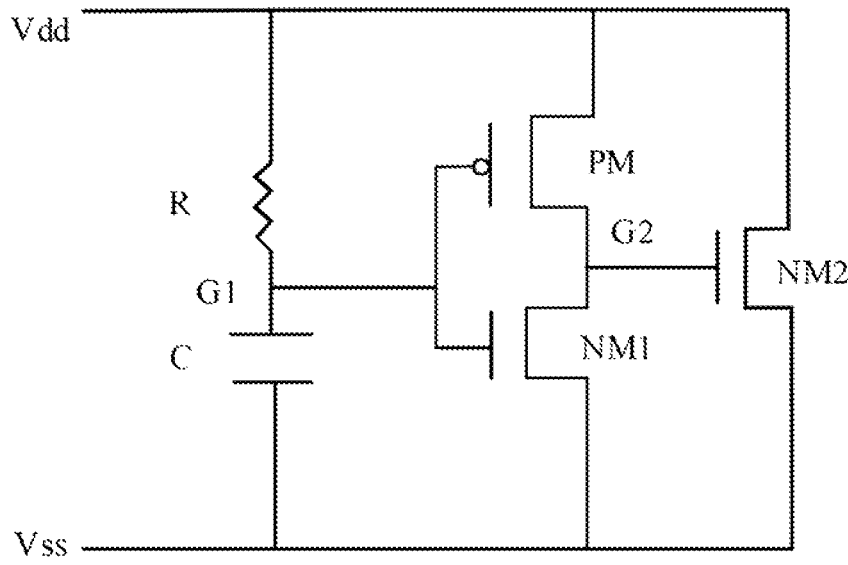
FIG. 10 is a structural diagram of a clamping circuit in another exemplary embodiment of a chip of the present disclosure.

FIG. 10 is a structural diagram of a clamping circuit in another exemplary embodiment of a chip of the present disclosure. The clamping circuit may include a capacitor C, a resistor R, a P-type transistor PM, a first N-type transistor NM1, and a second N-type transistor NM2. The resistor R is connected between a high level power supply terminal Vdd and a first node G1. The capacitor C is connected between the first node G1 and a low level power supply terminal Vss. A first electrode of the P-type transistor PM is connected to the high level power supply terminal Vdd, a second electrode of the P-type transistor PM is connected to a second node G2 and a gate electrode of the P-type transistor PM is connected to the first node G1. A first electrode of the first N-type transistor NM1 is connected to the second node G2, a second electrode of the first N-type transistor NM1 is connected to the low level power supply terminal Vss, and a gate electrode of the first N-type transistor NM1 is connected to the first node G1. A first electrode of the second N-type transistor NM2 is connected to the high level power supply terminal Vdd, a second electrode of the second N-type transistor NM2 is connected to the low level power supply terminal Vss, and a gate electrode of the second N-type transistor NM2 is connected to the second node G2. When static electricity occurs at the high level power supply terminal Vdd, the static electricity forms a high-frequency alternating current between the high level power supply terminal Vdd and the low level power supply terminal Vss. Under the action of the high-frequency alternating current, an impedance of the capacitor C decreases, a potential of the first node G1 is pulled down by the low level power supply terminal Vss, the P-type transistor PM is turned on, the high level power supply terminal Vdd inputs a high level signal to the second node G2, the second N-type transistor NM2 is turned on, and the high level power supply terminal Vdd discharges static electricity to the low level power supply terminal Vss through the second N-type transistor NM2.

The present exemplary embodiment skillfully integrates the electrostatic discharge protection structure and the clamping circuit to realize the electrostatic discharge protection of the full chip. The electrostatic discharge protection structure adopts a new layout method, which has the characteristics of small area, low trigger voltage, strong anti-latch capability, high electrostatic discharge protection capability, and small capacitance. The electrostatic discharge protection structure can be used for electrostatic discharge protection of low-voltage high-speed integrated circuit products.

Those skilled in the art will easily think of other embodiments of the disclosure after considering the specification and practicing the contents disclosed herein. The present disclosure is intended to cover any variant, usage or adaptation of the present disclosure, which follows the general principles of the present disclosure and includes the common knowledge or conventional technical means in the technical field not disclosed in the present disclosure. The specification and embodiments are to be considered exemplary only, and the true scope and spirit of the present disclosure are indicated by the claims.

It is to be understood that the present disclosure is not limited to the precise structures described above and illustrated in the accompanying drawings, and that various modifications and changes may be made without departing from its scope. The scope of the present disclosure is limited only by the appended claims.

The invention claimed is:

1. An electrostatic discharge protection structure, comprising:

a semiconductor substrate;

an N-type well located in the semiconductor substrate;

a P-type well located in the semiconductor substrate;

a first N-type doped portion located in the P-type well, wherein the first N-type doped portion comprises a first extension portion and a second extension portion that are connected to each other;

wherein an orthographic projection of the first extension portion on a target projection plane extends along a first direction, an orthographic projection of the second extension portion on the target projection plane extends along a second direction, the target projection plane is parallel to a plane where the semiconductor substrate is located, and the first direction intersects the second direction:

a first P-type doped portion located in the N-type well, wherein the first P-type doped portion comprises a third extension portion, a fourth extension portion, and a fifth extension portion connected between the third extension portion and the fourth extension portion;

wherein both an orthographic projection of the third extension portion on the target projection plane and an orthographic projection of the fourth extension portion on the target projection plane extend along the second direction, the orthographic projection of the second extension portion on the target projection plane is located between the orthographic projection of the third extension portion on the target projection plane and the orthographic projection of the fourth extension portion on the target projection plane, and an orthographic projection of the fifth extension portion on the target projection plane is located on a side of the orthographic projection of the second extension portion on the target projection plane away from the orthographic projection of the first extension portion on the target projection plane;

a second P-type doped portion located in the P-type well, wherein an orthographic projection of the second P-type doped portion on the target projection plane extends along the first direction, and is located on a side of an orthographic projection of the first N-type doped portion on the target projection plane away from an orthographic projection of the first P-type doped portion on the target projection plane; and a second N-type doped portion located in the N-type well, wherein an orthographic projection of the second N-type doped portion on the target projection plane extends along the first direction, and is located on a side of the orthographic projection of the first P-type doped portion on the target projection plane away from the orthographic projection of the first N-type doped portion on the target projection plane;

wherein the second P-type doped portion is electrically connected to the second N-type doped portion.

2. The electrostatic discharge protection structure of claim 1, further comprising:

a third N-type doped portion located in the P-type well, wherein an orthographic projection of the third N-type doped portion on the target projection plane and the orthographic projection of the first N-type doped portion on the target projection plane are arranged at intervals in the first direction;

wherein the third N-type doped portion comprises a sixth extension portion and a seventh extension portion that are connected to each other, an orthographic projection of the sixth extension portion on the target projection plane extends along the first direction, and an orthographic projection of the seventh extension portion on the target projection plane extends along the second direction; and a third P-type doped portion located in the N-type well, wherein an orthographic projection of the third P-type doped portion on the target projection plane and the orthographic projection of the first P-type doped portion on the target projection plane are arranged at intervals in the first direction;

wherein the third P-type doped portion comprises an eighth extension portion, a ninth extension portion, and a tenth extension portion connected between the eighth extension portion and the ninth extension portion, both an orthographic projection of the eighth extension portion on the target projection plane and an orthographic projection of the ninth extension portion on the target projection plane extend along the second direction, the orthographic projection of the seventh extension portion on the target projection plane is located between the orthographic projection of the eighth extension portion on the target projection plane and the orthographic projection of the ninth extension portion on the target projection plane, and an orthographic projection of the tenth extension portion on the target projection plane is located on a side of the orthographic projection of the seventh extension portion on the target projection plane away from the orthographic projection of the sixth extension portion on the target projection plane;

the orthographic projection of the second P-type doped portion on the target projection plane is located on a side of the orthographic projection of the third N-type doped portion on the target projection plane away from the orthographic projection of the third P-type doped portion on the target projection plane; and the orthographic projection of the second N-type doped portion on the target projection plane is located on a side of the orthographic projection of the third P-type doped portion on the target projection plane away from the orthographic projection of the third N-type doped portion on the target projection plane.

3. The electrostatic discharge protection structure of claim 2, wherein a part of the first extension portion and at least part of the third extension portion are oppositely arranged in the second direction, and another part of the first extension portion and at least part of the fourth extension portion are oppositely arranged in the second direction; and a part of the sixth extension portion and at least part of the eighth extension portion are oppositely arranged in the second direction, and another part of the sixth extension portion and at least part of the ninth extension portion are oppositely arranged in the second direction.

4. The electrostatic discharge protection structure of claim 2, wherein the P-type well comprises:

a first well region, wherein an orthographic projection of the first well region on the target projection plane extends along the first direction;

a second well region connected to the first well region, wherein an orthographic projection of the second well region on the target projection plane extends along the second direction; and a third well region connected to the first well region, wherein an orthographic projection of the third well region on the target projection plane extends along the second direction, and the orthographic projection of the third well region on the target projection plane and the orthographic projection of the second well region on the target projection plane are located on a same side of the orthographic projection of the first well region on the target projection plane;

wherein the first extension portion, the sixth extension portion and the second P-type doped portion are located in the first well region, the second extension portion is located in the second well region, and the seventh extension portion is located in the third well region.

5. The electrostatic discharge protection structure of claim 2, wherein at least part of the first extension portion and a part of the second P-type doped portion are oppositely arranged in the second direction, and at least part of the sixth extension portion and another part of the second P-type doped portion are oppositely arranged in the second direction; and at least part of the fifth extension portion and a part of the second N-type doped portion are oppositely arranged in the second direction, and at least part of the tenth extension portion and another part of the second N-type doped portion are oppositely arranged in the second direction.

6. The electrostatic discharge protection structure of claim 1, wherein an orthographic projection of the N-type well on the target projection plane surrounds an orthographic projection of the P-type well on the target projection plane;

wherein the semiconductor substrate is a P-type semiconductor substrate, and the electrostatic discharge protection structure further comprises:

an N-type deep well isolated between the semiconductor substrate and the P-type well.

7. The electrostatic discharge protection structure of claim 1, further comprising:

an annular doped portion, wherein an orthographic projection of the annular doped portion on the target projection plane surrounds an orthographic projection of the N-type well on the target projection plane and an orthographic projection of the P-type well on the target projection plane; and a doping type of the annular doped portion and a doping type of the semiconductor substrate are identical.

8. A chip, comprising the electrostatic discharge protection structure of claim 1.

9. The chip of claim 8, further comprising a first terminal and a second terminal, wherein the first terminal is connected to the first N-type doped portion, and the second terminal is connected to the first P-type doped portion.

10. The chip of claim 9, further comprising a high level power supply terminal, a low level power supply terminal, and a signal transmission terminal, wherein the first terminal is the high level power supply terminal, and the second terminal is the signal transmission terminal; or the first terminal is the signal transmission terminal, and the second terminal is the low level power supply terminal; or the first terminal is the high level power supply terminal, and the second terminal is the low level power supply terminal.

11. The chip of claim 8, further comprising a low level power supply terminal and a signal transmission terminal, wherein in a case that the electrostatic discharge protection structure comprises a third P-type doped portion and a third N-type doped portion, the signal transmission terminal is connected to the first P-type doped portion and the third N-type doped portion, and the low level power supply terminal is connected to the first N-type doped portion and the third P-type doped portion.

12. The chip of claim 11, wherein the signal transmission terminal comprises a signal output terminal and a signal input terminal, the chip comprises a plurality of the electrostatic discharge protection structures, and the plurality of the electrostatic discharge protection structures comprises:

a first electrostatic discharge protection structure, wherein the first P-type doped portion and the third N-type doped portion of the first electrostatic discharge protection structure are connected to the signal input terminal, and the first N-type doped portion and the third P-type doped portion of the first electrostatic discharge protection structure are connected to the low level power supply terminal; and a second electrostatic discharge protection structure, wherein the first P-type doped portion and the third N-type doped portion of the second electrostatic discharge protection structure are connected to the signal output terminal, and the first N-type doped portion and the third P-type doped portion of the second electrostatic discharge protection structure are connected to the low level power supply terminal.

13. The chip of claim 8, further comprising a high level power supply terminal, a low level power supply terminal, and a signal transmission terminal, wherein in a case that the electrostatic discharge protection structure comprises a third P-type doped portion and a third N-type doped portion, the signal transmission terminal is connected to the first P-type doped portion and the third N-type doped portion, the high level power supply terminal is connected to the first N-type doped portion, and the low level power supply terminal is connected to the third P-type doped portion.

14. The chip of claim 13, wherein the signal transmission terminal comprises a signal output terminal and a signal input terminal, the chip comprises a plurality of the electrostatic discharge protection structures, and the plurality of the electrostatic discharge protection structures comprises:

a first electrostatic discharge protection structure, wherein the first P-type doped portion and the third N-type doped portion of the first electrostatic discharge protection structure are connected to the signal input terminal, the first N-type doped portion of the first electrostatic discharge protection structure is connected to the high level power supply terminal, and the third P-type doped portion of the first electrostatic discharge protection structure is connected to the low level power supply terminal; and a second electrostatic discharge protection structure, wherein the first P-type doped portion and the third N-type doped portion of the second electrostatic discharge protection structure are connected to the signal output terminal, the first N-type doped portion of the second electrostatic discharge protection structure is connected to the high level power supply terminal, and the third P-type doped portion of the second electrostatic discharge protection structure is connected to the low level power supply terminal.

15. The chip of claim 8, wherein the chip is a dynamic random access memory or a static random access memory.

* * * * *